(12) United States Patent
Kim et al.

(10) Patent No.: US 12,040,302 B2
(45) Date of Patent: Jul. 16, 2024

(54) DEVICE PACKAGE HAVING A LATERAL POWER TRANSISTOR WITH SEGMENTED CHIP PAD

(71) Applicant: Infineon Technologies Austria AG, Villach (AT)

(72) Inventors: Hyeongnam Kim, Chandler, AZ (US); Mohamed Imam, Chandler, AZ (US)

(73) Assignee: Infineon Technologies Austria AG, Villach (AT)

( * ) Notice: Subject to any disclaimer, the term of this patent is extended or adjusted under 35 U.S.C. 154(b) by 280 days.

(21) Appl. No.: 17/523,119

(22) Filed: Nov. 10, 2021

(65) Prior Publication Data

US 2022/0157764 A1  May 19, 2022

(30) Foreign Application Priority Data

Nov. 18, 2020 (EP) ..................................... 20208456

(51) Int. Cl.
*H01L 21/78* (2006.01)
*H01L 21/66* (2006.01)
(Continued)

(52) U.S. Cl.
CPC .............. *H01L 24/40* (2013.01); *H01L 21/78* (2013.01); *H01L 22/20* (2013.01); *H01L 22/32* (2013.01);
(Continued)

(58) Field of Classification Search
CPC ......... H01L 24/40; H01L 21/78; H01L 22/20; H01L 22/32; H01L 24/48; H01L 24/73;
(Continued)

(56) References Cited

U.S. PATENT DOCUMENTS 6,841,852 B2 * 1/2005 Luo .................... H01L 24/49
257/E23.079
7,005,708 B2 * 2/2006 Mergens ............. H01L 29/4238
257/361
(Continued)

FOREIGN PATENT DOCUMENTS

EP           1513195 A1     3/2005

*Primary Examiner* — Vu A Vu
(74) *Attorney, Agent, or Firm* — Murphy, Bilak & Homiller, PLLC (57) ABSTRACT

A transistor package having four terminals includes a semiconductor transistor chip and a semiconductor diode chip. The semiconductor transistor chip includes a control electrode and a first load electrode on a first surface and a second load electrode on a second surface opposite the first surface. The semiconductor diode chip includes a first diode electrode on a first surface and a second diode electrode on a second surface opposite the first surface. The transistor package includes a first terminal electrically connected to the control electrode, a second terminal electrically connected to the first diode electrode, a third terminal electrically connected to the first load electrode and a fourth terminal electrically connected to the second load electrode. At least the first terminal, the second terminal and the third terminal protrude from one side of transistor package. The first terminal is arranged between the second terminal and the third terminal.

15 Claims, 6 Drawing Sheets

(51) Int. Cl.
*H01L 23/00* (2006.01)
*H01L 29/423* (2006.01)

(52) U.S. Cl.
CPC .............. *H01L 24/48* (2013.01); *H01L 24/73* (2013.01); *H01L 24/84* (2013.01); *H01L 24/85* (2013.01); *H01L 29/4238* (2013.01); *H01L 2224/40245* (2013.01); *H01L 2224/48245* (2013.01); *H01L 2224/73221* (2013.01); *H01L 2924/13064* (2013.01); *H01L 2924/37001* (2013.01)

(58) Field of Classification Search
CPC ..... H01L 24/84; H01L 24/85; H01L 29/4238; H01L 2224/40245; H01L 2224/48245; H01L 2224/73221; H01L 2924/13064; H01L 2924/37001; H01L 22/14; H01L 23/544; H01L 2223/5442; H01L 2223/54486; H01L 2924/00014; H01L 23/4824; H01L 2224/0603; H01L 2224/48247; H01L 2224/49113; H01L 23/48; H01L 21/50; H01L 24/02; H01L 24/06; H01L 24/09; H01L 29/7786; H01L 2224/04042; H01L 2224/0601; H01L 2224/0612; H01L 2224/0901; H01L 2224/0912

USPC ........................................................ 257/288
See application file for complete search history.

(56) References Cited

U.S. PATENT DOCUMENTS

| | | | | |
|---|---|---|---|---|
| 8,274,121 | B2 * | 9/2012 | Vorhaus | H03F 3/265 |
| | | | | 438/286 |
| 8,461,669 | B2 * | 6/2013 | Yang | H01L 23/49541 |
| | | | | 257/E23.033 |
| 8,692,330 | B2 * | 4/2014 | Otsuru | H01L 29/1045 |
| | | | | 257/355 |
| 8,710,441 | B2 * | 4/2014 | Bernacki | G01K 11/006 |
| | | | | 250/338.1 |
| 9,070,550 | B2 * | 6/2015 | Kobayashi | H01L 24/05 |
| 9,147,647 | B2 * | 9/2015 | Kaneda | H01L 24/92 |
| 9,842,797 | B2 * | 12/2017 | Carpenter | H01L 23/4952 |
| 10,050,025 | B2 * | 8/2018 | Noquil | H01L 23/49838 |
| 10,204,845 | B2 * | 2/2019 | Otremba | H01L 23/49551 |
| 11,145,579 | B1 * | 10/2021 | Kinzer | H01L 23/49575 |
| 11,164,969 | B2 * | 11/2021 | Edwards | H01L 23/528 |
| 11,469,205 | B2 * | 10/2022 | Williams | H01L 21/561 |
| 2006/0131745 | A1 | 6/2006 | Yutani | |
| 2015/0035080 | A1 | 2/2015 | Matsumoto et al. | |

\* cited by examiner

DEVICE PACKAGE HAVING A LATERAL POWER TRANSISTOR WITH SEGMENTED CHIP PAD

TECHNICAL FIELD

This disclosure relates generally to the technique of packaging lateral power transistors, and in particular to techniques of connecting pads of a lateral power transistor chip to terminals of a device package.

BACKGROUND

The influence of packaging on the fabrication yield within a current technology platform is among the key aspects for next generation transistor package design. The fabrication yield depends, inter alia, on minimizing the number of material defects in the semiconductor substrate and on improving the process reliability of semiconductor processing during integrated circuit fabrication. While testing on wafer level allows to avoid packaging of faulty chips, the overall fabrication yield is still affected by a variety of packaging processes, including the formation of the chip to package terminal interconnect, soldering, encapsulation, etc.

SUMMARY

According to an aspect of the disclosure, a device package comprises a semiconductor chip. The semiconductor chip comprises a lateral power transistor, a control pad, a first load pad, and a second load pad. At least one of the first load pad and the second load pad is segmented into a plurality of load pad segments electrically insulated from each other. Each load pad segment is associated with a sub-area of an active area of the lateral power transistor. The device package terminals comprise a control terminal electrically connected to the control pad, a first terminal electrically connected to the one of the first load pad and the second load pad which is segmented into a plurality of load pad segments via a first electrical interconnect, and a second terminal electrically connected to the other load pad via a second electrical interconnect. The first electrical interconnect comprises a plurality of connector elements connecting to a subset of the load pad segments, wherein the subset of the load pad segments is associated with non-defective sub-areas of the active area of the lateral power transistor.

According to another aspect of the disclosure, a method of manufacturing a device package comprising a semiconductor chip, the semiconductor chip including a lateral power transistor, comprises wafer processing to form a plurality of lateral power transistors in a wafer. An active area of each lateral power transistor is associated with a control pad, a first load pad and a second load pad of the semiconductor chip to be diced out of the wafer. At least one of the first load pad and the second load pad is segmented into a plurality of load pad segments which are electrically insulated from each other and which are each associated with a sub-area of the active area of the lateral power transistor. The method further comprises wafer testing to distinguish between non-defective sub-areas and defective sub-areas of the lateral power transistor. The wafer is diced to singularize the semiconductor chips. A semiconductor chip is packaged, wherein only the load chip pad segments associated with non-defective sub-areas are electrically connected to a load terminal of the device package.

BRIEF DESCRIPTION OF THE DRAWINGS

In the drawings, like reference numerals designate corresponding similar parts. The features of the various illustrated embodiments can be combined unless they exclude each other and/or can be selectively omitted if not described to be necessarily required. Embodiments are depicted in the drawings and are exemplarily detailed in the description which follows.

DETAILED DESCRIPTION

It is to be understood that the features of the various exemplary embodiments and examples described herein may be combined with each other unless specifically noted otherwise.

As used in this specification, the terms "electrically connected" or "connected" or similar terms are not meant to mean that the elements are directly contacted together; intervening elements may be provided between the "electrically connected" or "connected" elements, respectively. However, in accordance with the disclosure, the above-mentioned and similar terms may, optionally, also have the specific meaning that the elements are directly contacted together, i.e. that no intervening elements are provided between the "electrically connected" or "connected" elements, respectively.

Further, the words "over" or "beneath" with regard to a part, element or material layer formed or located or arranged "over" or "beneath" a surface may be used herein to mean that the part, element or material layer be located (e.g. placed, formed, arranged, deposited, etc.) "directly on" or "directly under", e.g. in direct contact with, the implied surface. The word "over" or "beneath" used with regard to a part, element or material layer formed or located or arranged "over" or "beneath" a surface may, however, either be used herein to mean that the part, element or material layer be located (e.g. placed, formed, arranged, deposited, etc.) "indirectly on" or "indirectly under" the implied surface, with one or more additional parts, elements or layers being arranged between the implied surface and the part, element or material layer.

Figure 1:
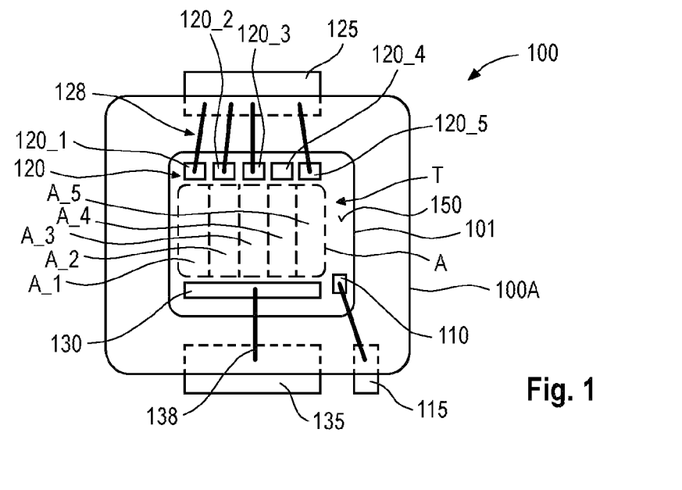
FIG. 1 is a schematic top view on a first embodiment of an exemplary device package containing a semiconductor chip including a power transistor.

Referring to FIG. 1, an exemplary device package 100 comprises a semiconductor chip 101. The semiconductor chip 101 includes a lateral power transistor T which is described in more detail further below. Further, the semiconductor chip 101 includes a control pad 110, and a first load pad 120 and a second load pad 130. The control pad 110, the first load pad 120 and the second load pad 130 may be located on a top surface 150 of the semiconductor chip 101.

At least one of the first load pad 120 and the second load pad 130 is segmented into a plurality of load pad segments which are electrically insulated from each other. In FIG. 1, e.g. the first load pad 120 is segmented into a number N of first load pad segments 120_1, 120_2, ..., 120_N. In the example shown, N=5. Generally, N may be an integer in the range between 2 and, e.g., 20 or even more.

The lateral power transistor T has an active area A. The active area A is subdivided into sub-areas comprising sub-areas A_1, ..., A_N. Each first load pad segment 120_1, ..., 120_N is associated with a corresponding sub-area A_1, ..., A_N.

The semiconductor device 100 further includes device package terminals 115, 125, 135. The device package terminals 115, 125, 135 are configured to electrically connect the device package 100 to external circuitry such as, e.g. an application board (not shown). Hence, the device package terminals 115, 125, 135 may be exposed and/or accessible at a periphery 100A of the device package 100.

A control terminal 115 of the device package 100 is electrically connected to the control pad 110 of the semiconductor chip 101. A first terminal 125 of the device package 100 is electrically connected to the one of the first load pad and the second load pad which is segmented into a plurality of load pad segments (in the example shown: the first load pad 120) via a first electrical interconnect 128. A second terminal 135 of the device package 100 is electrically connected to the other load pad (in the example shown: the second load pad 130) via a second electrical interconnect 138.

The first electrical interconnect 128 comprises a plurality NC of connector elements 128_1, 128_2, ..., 128_NC connecting to a subset of the load pad segments 120_1, ..., 120_N. In the example shown in FIG. 1, NC=4 and the subset of the load pad segments is composed of segment 120_1, segment 120_2, segment 120_3, and segment 120_5. The connector elements 128_1, 128_2, ..., 128_NC may, e.g., be wires and/or ribbons and/or clips.

The subset of the load pad segments is associated with non-defective sub-areas of the active area A of the lateral power transistor T. In the example shown in FIG. 1, the non-defective sub-areas of the active area A are sub-area A_1, sub-area A_2, sub-area A_3, and sub-area A_5.

That is, in the example shown in FIG. 1, the load pad segment 120_4 is not connected to a connector element of the first electrical interconnect 128. The load pad segment 120_4 may be associated with a defective sub-area, namely sub-area A_4 in the example shown.

Differently put, the first electrical interconnect 128 is configured in a way that a defective sub-area (here sub-area A_4) of the lateral transistor T is not electrically connected to the first terminal 125 of the device package 100. In that way, a small failing section of the lateral transistor T is lost but a majority of the good device sections is saved. As long as the failing section is small enough to keep the lateral transistor T within its specifications, the device package 100 is still functional. This allows to keep the fabrication yield at a high rate, since a "small" defect (i.e. a small number of defective sub-areas) does not result in production rejects.

Stated differently, the concept of identifying one or more defective sub-areas of the lateral transistor T and isolating/disconnecting these one or more defective sub-areas in the device package 100 from external connectivity may significantly improve the fabrication yield. This will be explained in the following by way of an example. In this example, the lateral power transistor T is exemplarily represented by a HEMT (High Electron Mobility Transistor). HEMTs provide for high breakdown fields compared to Si transistors and allow operation at high voltages and low leakage currents. However, they are more prone to the occurrence of material defects during fabrication than Si devices and may therefore take particular benefit from the concept of this disclosure. In general, however, the concept of this disclosure can also be applied to other lateral power transistors, for example IGBTs (Insulated Gate Bipolar Transistor), MOSFETs (Metal Oxide Semiconductor Field Effect Transistor), JFETs (Junction Gate Field Effect Transistor), thyristors, or BJTs (Bipolar Junction Transistor).

The fabrication yield of HEMTs as lateral power transistors is reversely proportional to the device size or RDSon (drain-source on resistance) at a given process technology level. If the yield of 560 mΩ devices is 90%, then the yield of 280 mΩ devices will be about 81%. Accordingly, the yield of 35 mΩ devices will then be only 18.5%. As such, the given fabrication technology leading to 90% yield for 560 mΩ devices will produce only 18.5% fabrication yield for 35 mΩ devices.

The new device layout design as disclosed herein improves the yield within a given technology platform by simply segmenting a "big" load pad (e.g. the first load pad 120) into multiple "small" load pads (i.e. the first load pad segments 120_1, ..., 120_N).

That way, the fabrication yield of the low RDSon devices according to the disclosure will be similar to the fabrication yield of a device using only one segment (corresponding to one active sub-area). For example, 16 segments each having an RDSon of 560 mΩ connected in parallel are equivalent to an RDSon of 35 mΩ. 90% fabrication yield of a 560 mΩ device will give the same 90% fabrication yield for a device according to this disclosure of ~39 mΩ (16 segments×0.9 yield results in 14~15 non-defective segments—this corresponds to a device having an RDSon of 38 mΩ to 40 mΩ).

More specifically, let the fabrication yield of a (conventional) 70 mΩ device be Y1. Failure rate F1 of the 70 mΩ device is then F1=1−Y1. The fabrication yield of a (conventional) 140 mΩ device is Y2. Failure rate F2 of the 140 mΩ device is F2=1−Y2. Knowing that the 70 mΩ device is equivalent to two of the 140 mΩ devices, the correlation between Y1 and Y2 is as follows:

$$Y1 = Y2 \times Y2 = Y2^2 \text{ and}$$

$$F1 = F2 \times Y2 + F2 \times F2 + Y2 \times F2 = Y2 \times F2 + F2 \times (F2 + Y2)$$

$$= Y2 \times F2 + F2 = F2 \times (2 - F2).$$

For example, the fabrication yield Y2 of a (conventional) 140 mΩ device is Y2=0.65 and then F2=0.35. The fabrication yield Y1 of a (conventional) 70 mΩ device is then Y1=0.65²=0.42. That way, the fabrication yield Y0 of a (conventional) 35 mΩ device is estimated to Y0=Y1²=0.42²=0.18.

The table below shows the estimated fabrication yields for conventional devices of RDSon from 560 mΩ to 35 mΩ.

| RDSon (mΩ) | Estimated yield |
|---|---|
| 560 | 90.00% |
| 280 | 81.00% |
| 140 | 65.61% |
| 70 | 43.05% |
| 35 | 18.53% |

However, as mentioned above, with the "segmented device" concept in accordance with the disclosure, N=16 segments (i.e. sub-areas A_1, . . . , A_16) of RDSon of 560 mΩ in parallel are equivalent to RDSon of 35 mΩ. Then, based on a 90% fabrication yield of each 560 mΩ segment (sub-area A_1, . . . , A_16), 14~15 segments (i.e. 16 segments×0.9) will be good in average. Hence, if the 1~2 defective segments (corresponding to sub-area A_4 of FIG. 1) is (are) not connected to the corresponding device terminal (in FIG. 1 the first terminal 125), a device 100 having RDSon of 38~40 mΩ is produced with the same 90% fabrication yield as a conventional 560 mΩ device. This device still meets the required device specifications and therefore qualifies as a "good" device.

It is to be noted that for simplicity of explanation the above considerations are based on the (idealized) assumptions that adjacent segments (i.e. active sub-areas A_1, . . . , A_N) do not interact with each other and that failures are only related to gate-to-drain, source-to-drain or source-to-gate defects. Even though these assumptions are not always strictly met, the above considerations remain largely valid in many practical cases.

From the above it is apparent that the higher the number N of segments the more narrow is the distribution of RDSon and the better is thus the probability to save a partially defective lateral transistor for implementation in a device package.

Figure 2A:
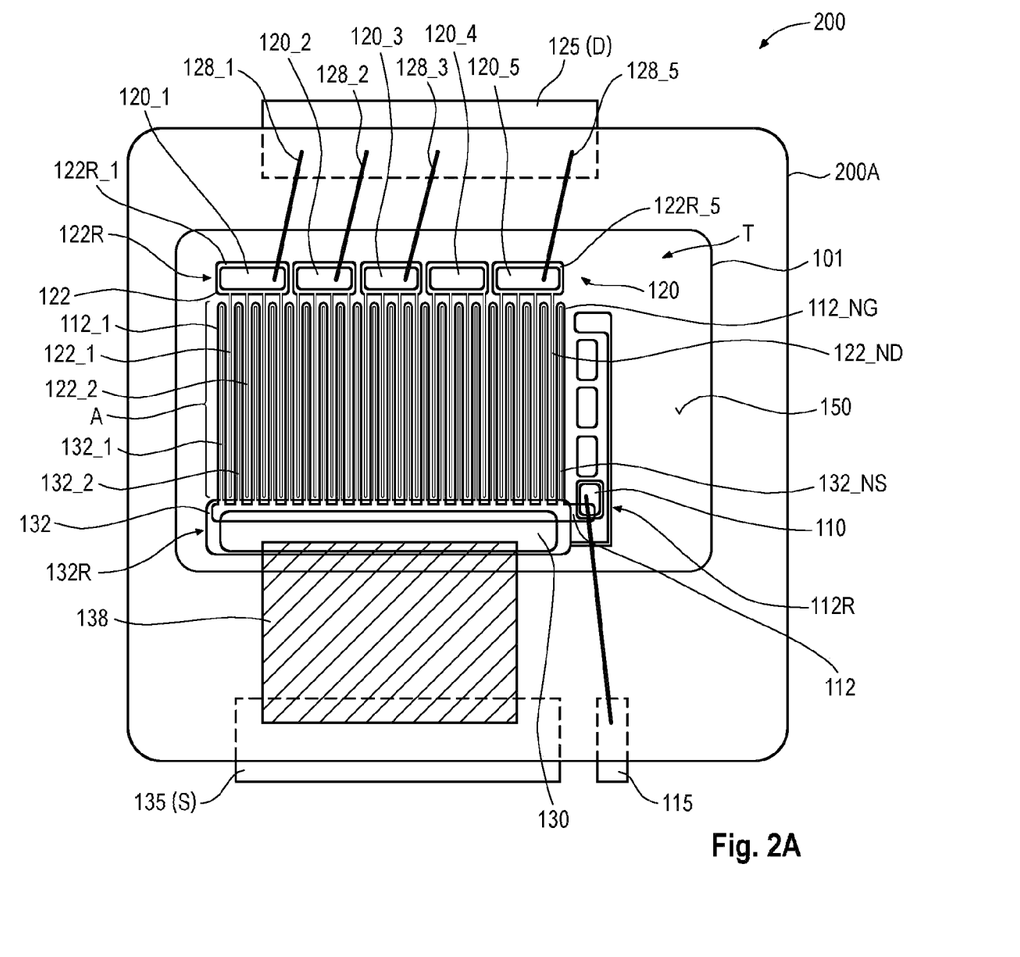
FIG. 2A is a schematic top view on a second embodiment of an exemplary device package containing a semiconductor chip including a power transistor.

FIG. 2A is a schematic top view on a second embodiment of an exemplary device package 200 containing a semiconductor chip 101 including a lateral power transistor T. The periphery of the device package 200 is denoted by reference sign 200A. The device package 200 is a more detailed illustration of exemplary features of device package 100 and reference is made to the description of device package 100 to avoid reiteration. Features described in conjunction with FIGS. 2A and 2B in greater detail may be selectively implemented in the device package 100.

By way of example, the control pad 110 may be a gate pad of the semiconductor chip 101. The control pad 110 may be electrically connected to and e.g. arranged atop a control (e.g. gate) electrode metallization 112 of the semiconductor chip 101. The first load pad 120 may be a drain (D) pad of the semiconductor chip 101 electrically connected to and e.g. arranged atop a first (e.g. drain) metallization 122 of the semiconductor chip 101. The second load pad 130 may be a source (S) pad of the semiconductor chip 101 electrically connected to and e.g. arranged atop a second (e.g. source) metallization 132 of the semiconductor chip 101. In other examples, the control pad 110 may be formed by the control electrode metallization 112 itself and/or the first load pad 120 may be formed by the first metallization 122 itself and/or the second load pad 130 may be formed by the second metallization 132 itself and each of these pads 110, 120, 130 may be defined by respective openings in an upper passivation layer (see FIGS. 4B and 4D). In FIG. 2A, the second electrical interconnect 138 is, e.g., formed by a ribbon or clip but can also be formed by multiple wires.

Without restriction of generality, the first load pad 120 may be the source (S) pad and the second load pad 130 may be the drain (D) pad. In this case, the first metallization 122 would be the source metallization and the second metallization 132 would be the drain metallization.

The active area A of the lateral power transistor T is located between the first load pad 120 and the second load pad 130. The active area A comprises a device structure of the transistor T. In order to provide for a large gate width Wg, the device structure may comprise interdigitated drain and source electrodes formed by the (structured) metallization 122 and 132, respectively. The device structure may further comprise and a gate electrode formed by the (structured) metallization 112 which runs between the interdigitated source and drain electrodes.

Figure 2B:
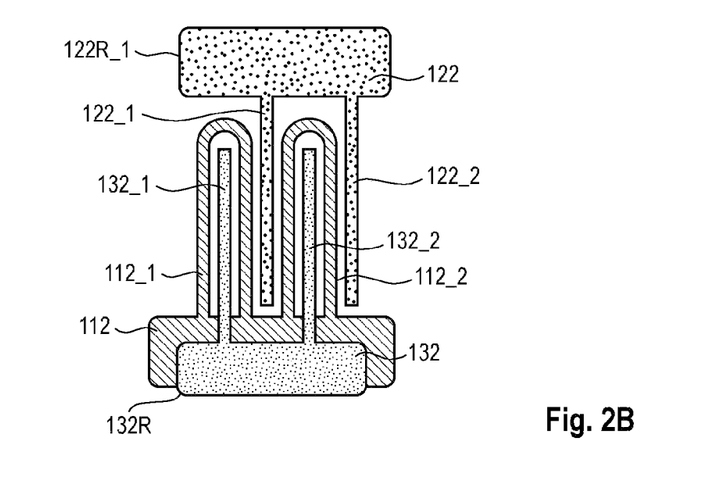
FIG. 2B is an enlarged top view on a portion of an active area of the exemplary power transistor of FIG. 2A.

There are many different possibilities to provide for a device structure having interdigitated drain and source electrodes and a gate electrode running therebetween. FIGS. 2A and 2B illustrates an exemplary electrode pattern having a source electrode and a drain electrode of a comb-type meshing finger structure. More specifically, a source electrode is shaped to contain a number NS of source electrode columns 132_1, 132_2, . . . 132_NS protruding from a common source electrode row 132R of the source metallization 132, a drain electrode is shaped to contain a number ND of drain electrode columns 122_1, 122_2, . . . 122_ND protruding from a (segmented) drain electrode row 122R of the drain metallization 122 (wherein the N segments of the drain electrode row 122R are denoted by reference signs 122R_1, . . . , 122R_N) and a gate electrode is shaped in the gate metallization 112 to extend between the interdigitated source and drain electrode columns 132_1, 132_2, . . . , 132_NS and 122_1, 122_2, . . . 122_ND, respectively.

The active area A may have a multi-finger gate structure. For example, the gate electrode may be formed by a number of NG gate fingers 112_1, . . . , 112_NG. Each gate finger 112_1, 112_2, . . . , 112_NG may encompass a corresponding column of a load electrode. In the example shown in FIGS. 2A and 2B, each gate finger 112_1, 112_2, . . . , 112_NG encompasses a single source electrode column 132_1, 132_2, . . . , 132_NS.

More specifically, each gate finger 112_1, . . . , 112_NG may protrude from a common gate electrode row 112R of the gate metallization 112 and runs around a source electrode column 132_1, 132_2, . . . , 132_NS along an U-shaped path in the space between this source electrode column 132_1, 132_2, . . . , 132_NS and the neighboring drain electrode columns 122_1, 122_2, . . . 122_ND. In this specific example, e.g. NS=NG.

Each drain pad segment 120_1, 120_2, . . . , 120_N is associated with a sub-area A_1, . . . , A_N of the active area A of the lateral power transistor T (see FIG. 1). More specifically, each drain pad segment 120_1, 120_2, . . . , 120_N is connected to one segment 122R_1, . . . , 122R_N of the segmented drain electrode row 122R in the drain metallization 122. The segments 122R_1, . . . , 122R_N of the segmented drain electrode row 122R in the drain metallization 122 are electrically disconnected from each other. Each segment 122R_1, . . . , 122R_N of the segmented drain electrode row 122R is, e.g., connected to one or a plurality of drain electrode columns 122_1, 122_2, . . . 122_ND. In the example shown in FIG. 2A, each segment 122R_1, . . . , 122R_N is, e.g., connected to a group of 4 drain electrode columns 122_1, . . . 122_ND of the drain electrode row 122R. This number of drain electrode columns per segment of the drain electrode row may vary and may, e.g., be in a range between 1 and 20 or 2 and 15 or 5 and 10.

The multi-finger gate structure may have a regular pattern. Each sub-area A_1, A_2, . . . , A_N of the active area A may have a multi-finger sub-area gate structure (of, e.g., four gate fingers 112_1, . . . , 112_NG), and all multi-finger sub-area gate structures may be of the same pattern. In particular, a pitch between adjacent gate fingers 112_1, 112_2, . . . , 112_NG may be constant across a sub-area of the active area A or, e.g., across the entire active area A.

The multi-finger gate structure may have a number NG of gate fingers 112_1, 112_2, . . . , 112_NG in a range between e.g. 10 and 200 or 25 and 100 or 30 and 70.

Each multi-finger sub-area gate structure may have a number of gate fingers 112_1, 112_2, . . . , 112_NG in a range between e.g. 1 and 20 or 2 and 15 or 5 and 10.

Referring by way of example to the exemplary device package 200, 4 electrode columns 122_1, 122_2, . . . , 122_ND are connected to each of the five drain electrode segments 122R_1, . . . 122R_5. Hence, in this example as shown in FIGS. 2A and 2B, the active area A is divided into 5 sub-areas each containing 4 drain electrode columns 122_1, 122_2, . . . 122_4, 4 source electrode columns 132_1, 132_2, . . . 132_4 and 4 gate fingers 112_1, 112_2, . . . , 112_4.

It is to be noted that the first and second metallization 122, 132 (i.e. the load electrode metallization) may be structured out of a same metallization layer, i.e. may be on the same level of the semiconductor chip 101. The control electrode metallization 112 may, e.g., be a different metallization layer that runs on a different level so as to allow the common gate electrode row 112R to overlap the second metallization 132 without making electrical contact to the second metallization 132. For instance, the common gate electrode row 112R which interconnects the gate fingers 112_1, . . . , 112_NG crosses over or beneath the source electrode columns 132_1, . . . , 132_NS and/or the common source electrode row 132R which interconnects the source electrode columns 132_1, . . . , 132_NS (see FIG. 2B).

In another exemplary layout, the common gate electrode row 112R may be arranged adjacent to the (segmented) drain electrode row 122R (i.e. in the upper half of FIG. 2B rather than in the lower half as shown). In this case, the gate electrode row 112R may cross over or beneath the drain electrode columns 122_1, . . . , 122_ND and/or the (segmented) drain electrode row 122R which interconnects the drain electrode columns 122_1, . . . , 122_ND.

Segmentation of the drain pad 120 (together with the underlying drain metallization 122) allows to make the fabrication method more robust against gate-to-drain related failures. Differently put, if the sub-area structure of the active area A is determined by drain pad segmentation and a common source pad 130 is provided, gate-to-source related failures cannot be filtered out by this concept.

Figure 3:
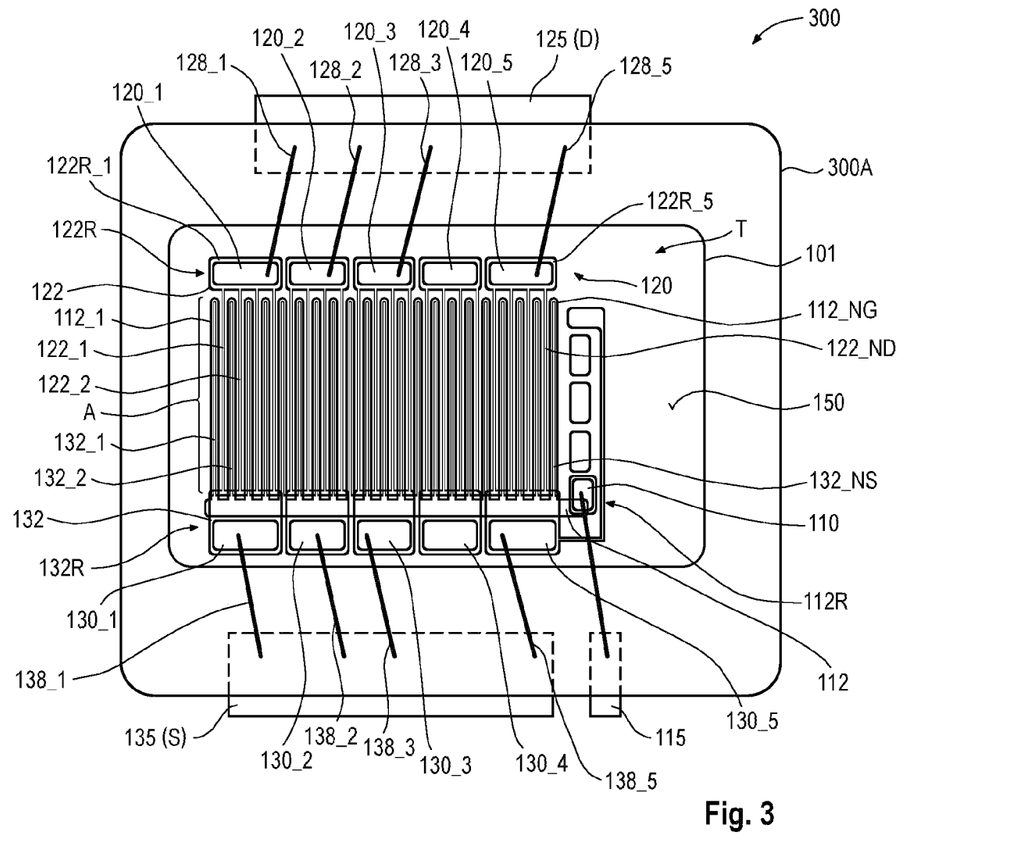
FIG. 3 is a schematic top view on a fourth embodiment of an exemplary device package containing a semiconductor chip including a power transistor.

FIG. 3 illustrates a device package 300 according to a fourth embodiment in which both the first (e.g. drain) load pad 120 together with the underlying first (e.g. drain) metallization 122 and the second (e.g. source) load pad 130 together with the underlying second (e.g. source) metallization 132 are segmented. In this case, any first load pad segments 120_1, . . . , 120_N and/or any second load pad segments 130_1, . . . , 130_N, which are associated with defective sub-areas A_1, . . . , A_N of the lateral power transistor T, will not be used for external connectivity, i.e. will not be connected to a connector element of the first and/or second electrical interconnect 128 and 138, respectively.

More specifically, in the example shown in FIG. 3, the first electrical interconnect 128 comprises a plurality of connector elements 128_1, 128_2, . . . connecting to a subset of the load (here: drain) pad segments 120_1, . . . , 120_5. The subset of the drain pad segments is composed of segment 120_1, segment 120_2, segment 120_3 and segment 120_5 of the first electrical interconnect 128. Likewise, the second electrical interconnect 138 comprises a plurality of connector elements 138_1, 138_2, . . . connecting to a subset of the load (here: source) pad segments 130_1, . . . , 130_5. The subset of the source pad segments is composed of segment 130_1, segment 130_2, segment 130_3 and segment 130_5. That is, the first electrical interconnect 128 is configured in a way that a defective sub-area (here: sub-area A_4) of transistor T is not electrically connected to the first terminal 125 of the device package 300 and the second electrical interconnect 138 is configured in a way that the defective sub-area A_4 of transistor T is not electrically connected to the second terminal 135 of the device package 300. The connector elements 128_1, 128_2, 128_3 and 128_5 and/or the connector elements 138_1, 138_2, 138_3 and 138_5 may, e.g., be wires and/or ribbons and/or clips. The periphery of the device package 300 is denoted by reference sign 300A.

Figure 2C:
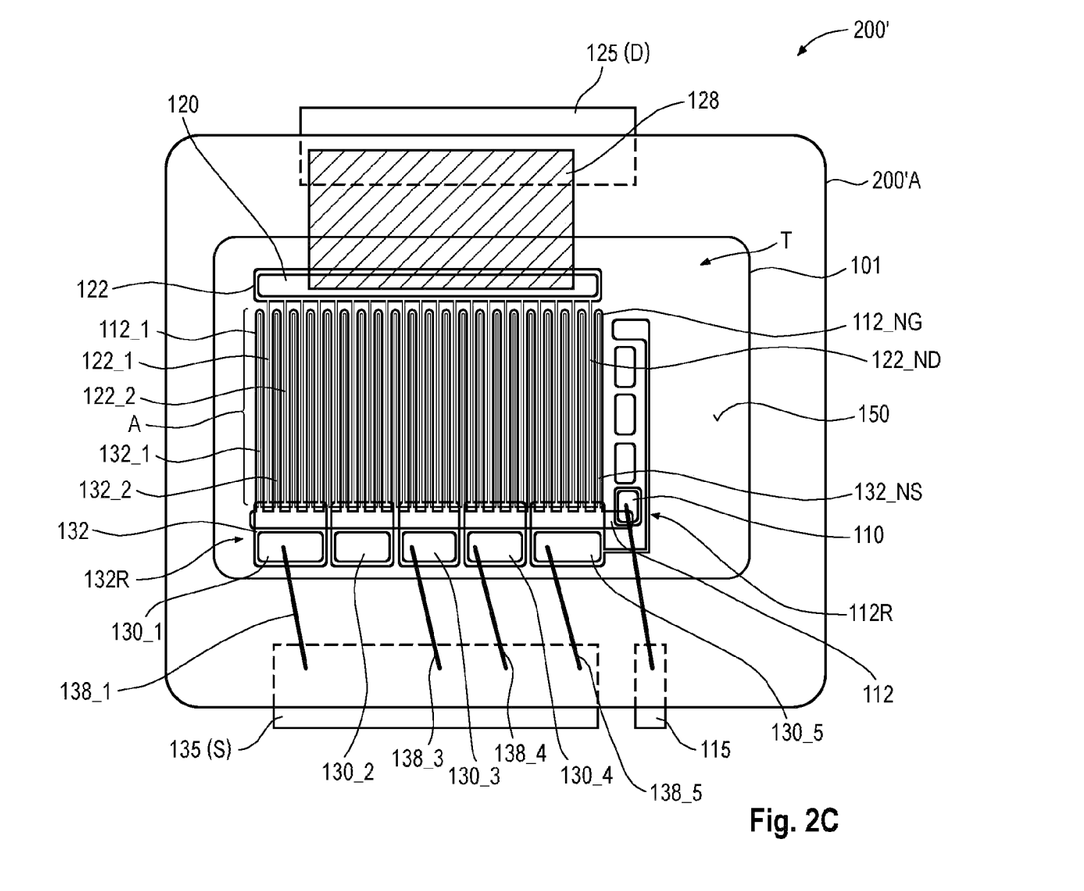
FIG. 2C is a schematic top view on a third embodiment of an exemplary device package containing a semiconductor chip including a power transistor.
Figure 4A:
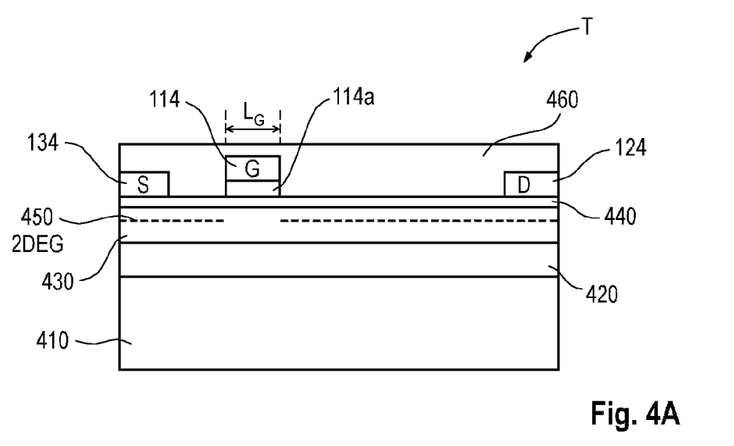
FIG. 4A is a schematic cross-sectional view of a portion of an active area of an exemplary power transistor.

FIG. 4A is a simplified schematic cross-sectional view of a portion of an active area of an exemplary lateral power transistor T (e.g. the transistor T of FIG. 2A, 2C or 3). By way of example, a GaN power HEMT is depicted. The power transistor T comprises a substrate 410, an optional transition layer 420, a first active layer 430 and a second active layer 440. A first load contact 124 (e.g. drain contact), a second load contact 134 (e.g. source contact) and a control contact (e.g. gate contact) 114 of gate length $L_G$ (and optionally disposed on a p-GaN layer 114a) are arranged over the second active layer 440. Further, one or more top passivation layers 460 may be provided atop the second active layer 440.

The substrate 410 may, e.g., be formed of a semiconductor material such as, e.g., silicon or silicon carbide. The transition layer 420 is formed over the substrate 410 and may, e.g., be formed of one or more AlN layers, GaN layers or composite AlGaN/GaN layers or any other material. The first and second active layers 430, 440 can form a III-V hetero-structure. For instance, the first active layer 430 may, e.g., be a GaN semiconductor layer and the second active layer 440 may, e.g., be an AlGaN layer. As known in the art, such GaN/AlGaN hetero-structure forms an active region allowing to establish a two-dimensional electron gas (2DEG) 450. More specifically, if the transistor T is a normally-on transistor, there is a 2DEG 450 under the gate contact 114, while if the transistor T is a normally-off transistor (as shown e.g. in FIG. 4A), there is no 2DEG 450 under the gate contact 114 without any proper bias on the gate contact 114. Other hetero-structures such as, e.g., GaAs/AlGaAs are also possible.

In FIG. 4A, $L_G$ denotes the gate length, with the gate width $W_G$ oriented in a direction perpendicular to $L_G$ (i.e. normal to the paper plane). In other words, the (total) gate width $W_G$ may correspond to the number of gate fingers NG×2×D, wherein D is the distance between the (segmented or common) gate electrode row 112R and the (segmented or common) drain electrode row 122R (see FIGS. 2A and 3).

Figure 4B:
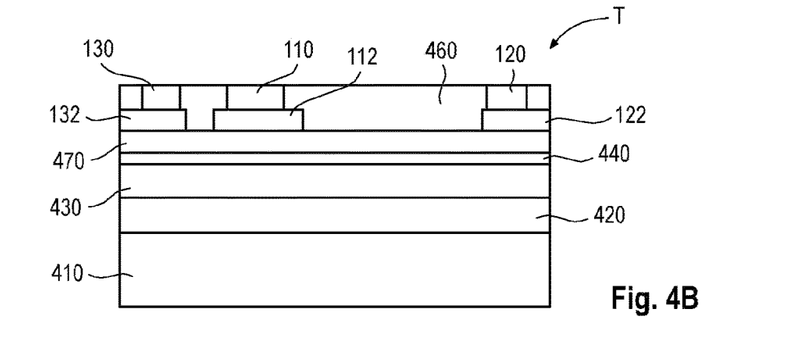
FIG. 4B is a schematic cross-sectional view of a portion of a non-active area of an exemplary power transistor.

FIG. 4B illustrates a schematic cross-sectional view of a portion of a non-active area beneath the control pad 110 and the load pads 120, 130 of an exemplary power transistor T. This illustration relates to a transistor design as exemplarily shown in FIGS. 2A, 2C, 3, i.e. a design in which the control pad 110 and the load pads 120, 130 are arranged outside the active area A. In other examples, the control pad 110 and the load pads 120, 130 may be arranged over the active area A as depicted in FIG. 4D.

Further to FIG. 4B, in this example the control pad 110 and the load pads 120, 130 are defined by openings above the corresponding metallization 112, 122 and 132, respectively. In other examples, pad metals atop the respective metallization 112, 122, 132 may be used to form the control pad 110 and the load pads 120, 130, respectively.

The first metallization 122 and the second metallization 132 may be provided over an insulating layer 470 extending over the first and second active layers 430, 440. The control electrode metallization 112 connects to the control contact 114 (gate contact) over the active area (see FIG. 4A), the first metallization 122 connects to the first load contact 124 (drain contact) over the active area and the second metallization 132 connects to the second load contact 134 (source contact) over the active area. As mentioned before, the first metallization 122 and the second metallization 132 may be used to shape a drain electrode pattern and/or a source electrode pattern in the active area A in a desired fashion, e.g. in the comb-type meshing design as illustrated in FIGS. 2A, 2B, 2C and 3. The first and/or second metallization 122, 132 may each be segmented as described above. The first and second metallization 122, 132 may be structured out of one metallization layer (and may thus extend on the same level) and may extend over the drain/source contacts 124, 134 on the III-V hetero-structure.

Figure 4C:
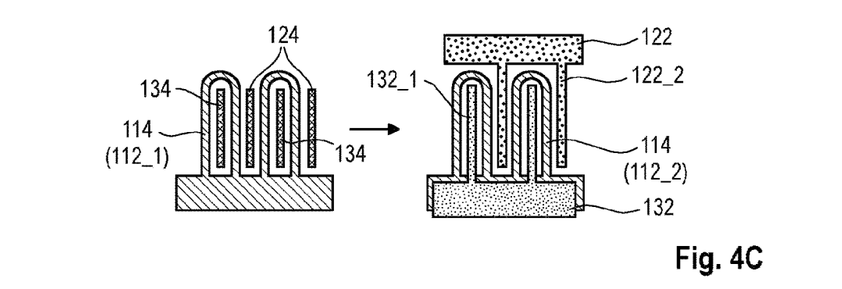
FIG. 4C is a schematic top view illustrating an exemplary pattern of gate, drain and source contacts (left portion) and an exemplary pattern of an overlying drain and source metallization (right portion).
Figure 4D:
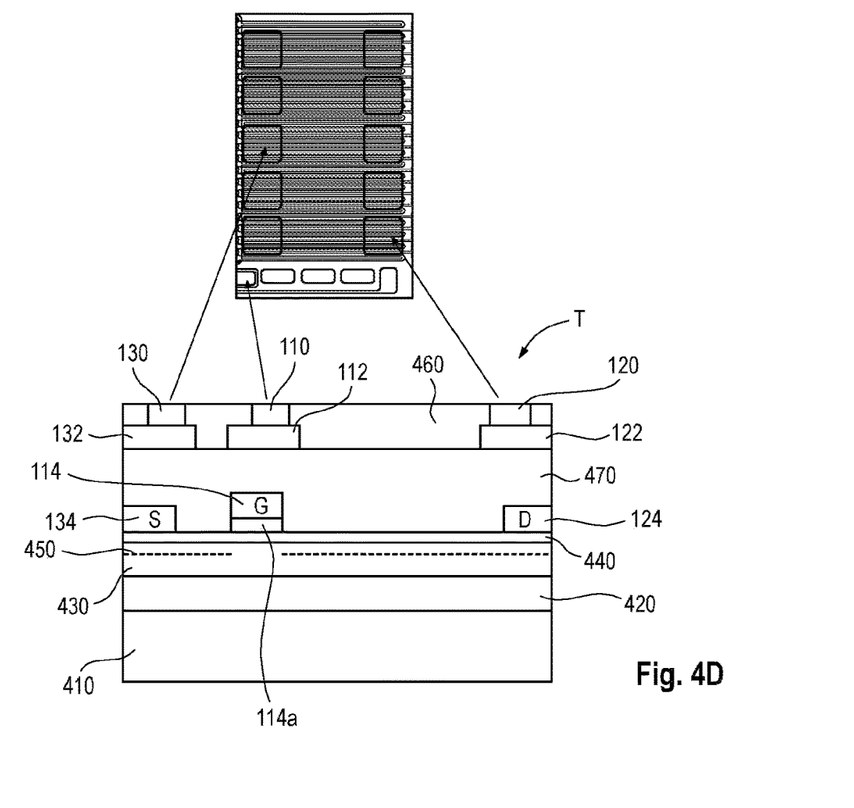
FIG. 4D is a schematic cross-sectional view of a portion of an active area of an exemplary power transistor where the drain and source pads are disposed in a vertical projection over the active area.

More specifically, the left portion of FIG. 4C illustrates an exemplary pattern of the gate, drain and source contacts 114, 124 and 134, respectively, and the right portion illustrates the exemplary pattern of the overlying drain and source metallization 122 and 132, respectively. The gate contact 114 forms the gate pattern of a desired shape (see, e.g., FIGS. 2A, 2B, 2C and 3 showing the gate fingers 112_1, ..., 112_/NG). The control electrode metallization 112 is not shown in the right portion of FIG. 4C. The control electrode metallization 112 is electrically insulated against the first and second metallization 122, 132 and connects to the gate contact 114.

FIG. 4D illustrates a schematic cross-sectional view of a portion of an active area of an exemplary power transistor T where the control pad 110 and the load pads 120, 130 are arranged in a vertical projection at least partly over the active area (i.e. the load pads 120, 130 overlap with the active area of the transistor T). An intermetallic redistribution structure extending through the insulating layer 470 and connecting the gate, drain and source contacts 114, 124 and 134 with the gate, drain and source metallization 112, 122 and 132, respectively, is not shown. Reference is made to the above description to avoid reiteration.

Figure 5A:
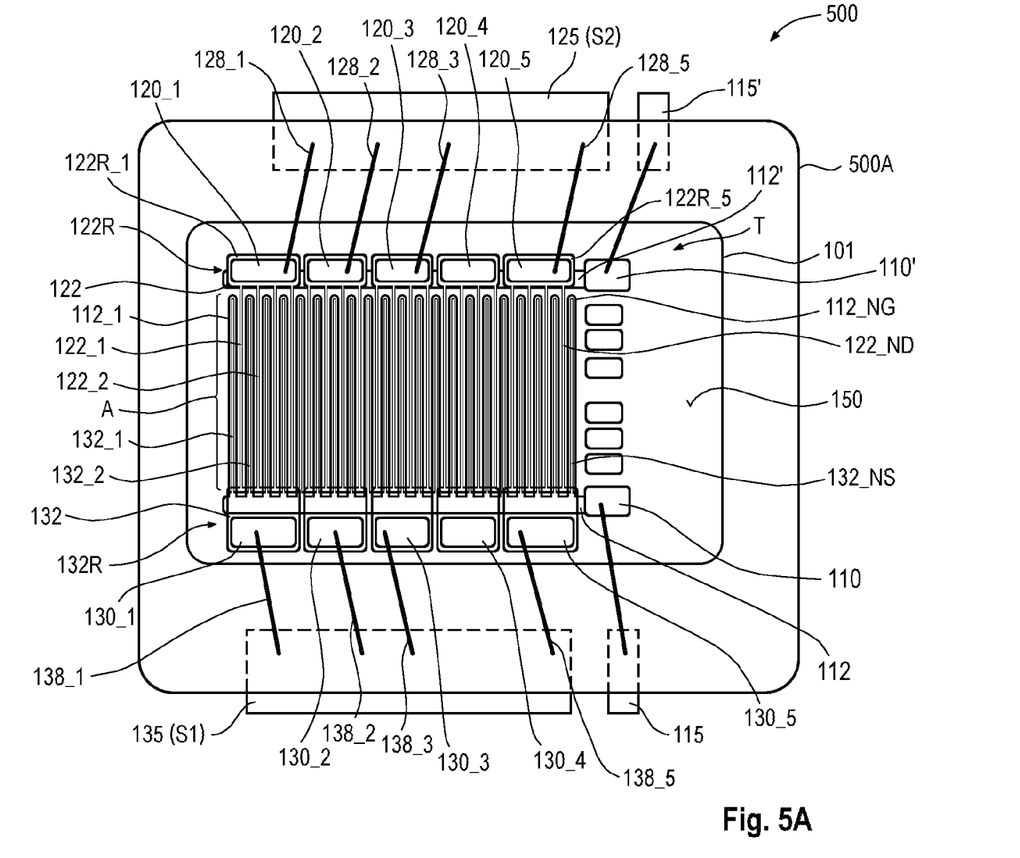
FIG. 5A is a schematic top view on a fifth embodiment of an exemplary device package containing a semiconductor chip including a power transistor.

FIG. 5A is a schematic top view on a fifth embodiment of an exemplary device package 500 containing a semiconductor chip 101 including a power transistor T. The load pad segmentation of device package 500 is similar to the load pad segmentation of device package 300, and reference is made to the above description to avoid reiteration. However, device package 500 distinguishes from device package 300 in that both the first load pad segments 120_1, ..., 120_N and the second load pad segments 130_1, ..., 130_N are source pad segments. More specifically, the first electrode columns 122_1, ..., 122_ND, the first electrode row 122R, the segments 122R_1, ..., 122R_N of the first electrode row, the first terminal 125, the first electrical interconnect 128 and the connector elements 128_1, ..., 128_NC thereof are all associated with a second source terminal rather than the drain terminal.

Figure 5B:
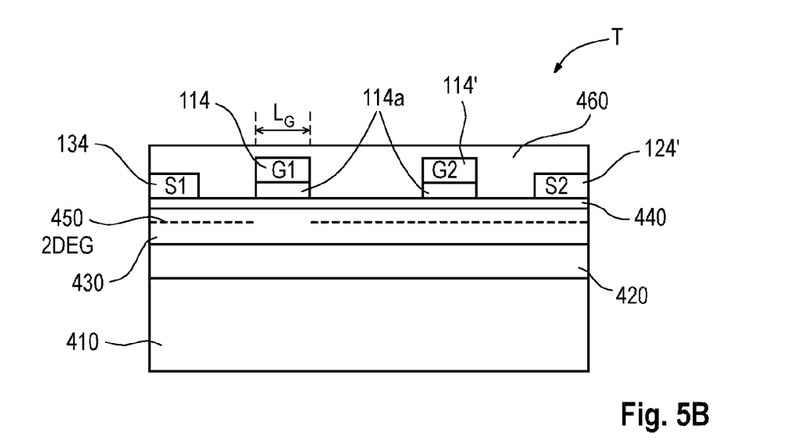
FIG. 5B is a schematic cross-sectional view of a portion of an active area of the exemplary power transistor of FIG. 5A.

Further, a second control terminal 115' and a second control electrode metallization 112' are provided and electrically connected to a second source (S2) contact 124' of the transistor T (corresponding to the first load (drain) contact 124 in FIG. 4A, compare FIGS. 4A and 5B). Hence, the dual gate device package 500 may implement a segmented bi-directional switch having two source terminals 135, 125 connected to the two source contacts 134 (S1) and 124' (S2), two gate terminals 115, 115' connected to the two gate contacts 114 (G1) and 114' (G2) and a common drain terminal connected to a common drain contact (not shown). The periphery of the device package 500 is denoted by reference sign 500A.

Figure 6:
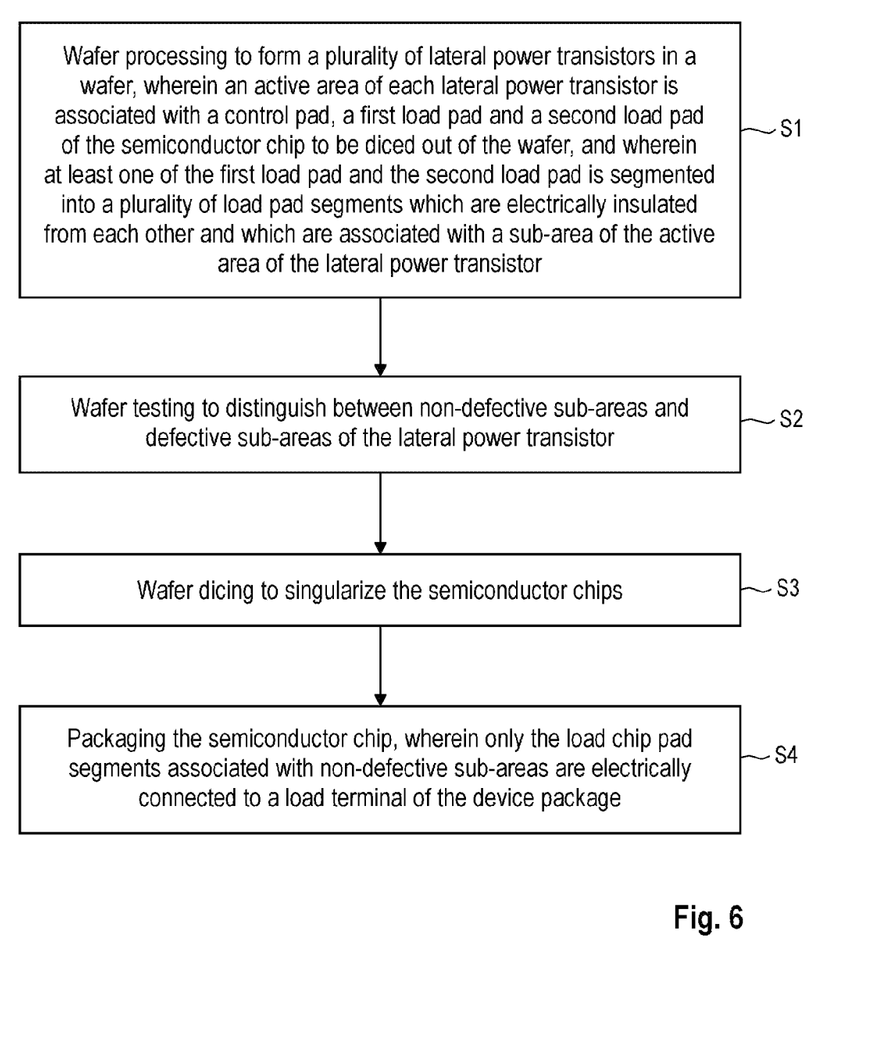
FIG. 6 is a flowchart illustration exemplary stages of a method of manufacturing a device package.

FIG. 6 illustrates a flowchart illustrating an exemplary method of manufacturing a device package such as, e.g., device package 100, 200, 200', 300, 500.

At S1 a wafer is processed to form a plurality of lateral power transistors in a wafer, wherein an active area of each lateral power transistor is associated with a control pad, a first load pad and a second load pad of the semiconductor chip to be diced out of the wafer. At least one of the first load pad and the second load pad is segmented into a plurality of load pad segments which are electrically insulated from each other. Each load pad segment is associated with a sub-area of the active area of the lateral power transistor.

At S2 the wafer is tested to distinguish between non-defective sub-areas and defective sub-areas of the lateral power transistor. Testing may be carried out during FE (front-end) testing. As known in the art, probe cards having a high number of probe needles may be used for wafer testing. During wafer testing a probe card is lowered down on the wafer and the probe needles make contact to the control pads 110, first load pads 120 and second load pads 130 on the wafer. More specifically, probe needles may individually contact to the first load pad segments 120_1, ..., 120_N and/or the second load pad segments 130_1, ..., 130_N of the first and second load pads 120 and 130, respectively. That way, information indicating which of the load pad segments is associated with non-defective sub-areas or with defective sub-areas of the active area of the power transistor may be obtained.

For instance, this information may be obtained by RDSon measurement and/or gate leakage current measurement and/or drain leakage current measurement and the classification of the individual sub-areas may be based on the measurement results. To this end, wafer testing may include measuring the RDSon value and/or gate leakage current value and/or drain leakage current value of each sub-area, and classifying the sub-areas into non-defective sub-areas and defective sub-areas may be based on a comparison of their respective measurement values with a predetermined threshold value.

At S3 the wafer is diced to singularize the wafer into the semiconductor chips. Wafer dicing may be carried out by any known dicing method including laser cutting, blade cutting, etc.

At S4 the semiconductor chips are packaged. During packaging only the load chip pad segments which are associated with non-defective sub-areas are electrically connected to a load terminal of the device package. To this end, the information about non-defective and/or defective sub-areas is used during the packaging process.

The electrical connections between the load chip pad segments and the load terminals of the device package may be carried out by any suitable technique, including wire bonding, ribbon bonding or clip bonding. In other words, device packages with package-individual first and/or second electrical interconnect are produced, wherein the design of the first and/or second electrical interconnect is based on the information about non-defective and/or defective sub-areas obtained during wafer testing. Due to the high degree of automation capacity in the context of package-individual bonding, wire bonding may be particularly suitable.

For package-individual bonding, one possibility is to store information indicative of the load chip pad segments associated with non-defective sub-areas or with defective sub-areas in a wafer test map. The wafer test map, which is usually electronic data stored in a memory, is then used for package-individual packaging.

Another possibility is to mark the load chip pad segments associated with non-defective sub-areas or with defective sub-areas during testing by applying test marks to the wafer. By way of example, each load chip pad segment which is associated with a defective sub-area may be labeled, e.g. marked by an e.g. visible substance. For example, a resist or varnish may be placed on each load chip pad segment associated with a defective sub-area. During packaging the test marks are detected or recognized and marked load chip pad segments are deselected from the process of applying the electrical interconnect between the semiconductor chip and the load terminal(s) of the device package. That way, functional device packages having an "incomplete" interconnect are produced.

The following examples pertain to further aspects of the disclosure:

Example 1 is a device package comprising a semiconductor chip, comprising a lateral power transistor, a control pad, a first load pad, and a second load pad, wherein at least one of the first load pad and the second load pad is segmented into a plurality of load pad segments electrically insulated from each other, and each load pad segment is associated with a sub-area of an active area of the lateral power transistor; and device package terminals comprising a control terminal electrically connected to the control pad; a first terminal electrically connected to the one of the first load pad and the second load pad which is segmented into a plurality of load pad segments via a first electrical interconnect; and a second terminal electrically connected to the other load pad via a second electrical interconnect, wherein the first electrical interconnect comprises a plurality of connector elements connecting to a subset of the load pad segments, wherein the subset of the load pad segments is associated with non-defective sub-areas of the active area of the lateral power transistor.

In Example 2, the subject matter of Example 1 can optionally include wherein a load pad segment which is not connected to a connector element is associated with a defective sub-area of the active area of the lateral power transistor.

In Example 3, the subject matter of Example 1 or 2 can optionally include wherein a connector element is a wire or a ribbon or a clip.

In Example 4, the subject matter of any preceding Example can optionally include wherein the first terminal is a source terminal of the transistor package.

In Example 5, the subject matter of any preceding Example can optionally include wherein the other load pad is also segmented into a plurality of load pad segments electrically insulated from each other, the second electrical interconnect comprises a plurality of connector elements connecting to a subset of the load pad segments of the other load pad, wherein the subset of the load pad segments of the other load pad is associated with non-defective sub-areas of the active area of the lateral power transistor.

In Example 6, the subject matter of any preceding Example can optionally include wherein the control pad is a common control pad electrically connected to a gate metallization layer of the semiconductor chip, wherein the gate metallization layer electrically connects to a gate structure in each sub-area.

In Example 7, the subject matter of any preceding Example can optionally include wherein each load pad segment is electrically connected to an individual metallization layer section of the semiconductor chip which are electrically insulated from each other, and wherein the individual metallization layer sections are each electrically connected to the active area of the lateral power transistor, thereby defining the sub-areas.

In Example 8, the subject matter of any preceding Example can optionally include wherein the active area has one multi-finger gate structure of a regular pattern.

In Example 9, the subject matter of Example 8 can optionally include wherein the multi-finger gate structure has a number of gate fingers in a range between 10 and 200 or 25 and 100 or 30 and 70.

In Example 10, the subject matter of any preceding Example can optionally include wherein each sub-area has a multi-finger sub-area gate structure, and all multi-finger sub-area gate structures are of the same pattern.

In Example 11, the subject matter of Example 10 can optionally include wherein each multi-finger sub-area gate structure has a number of gate fingers in a range between 1 and 20 or 2 and 15 or 5 and 10.

Example 12 is method of manufacturing a device package comprising a semiconductor chip, the semiconductor chip including a lateral power transistor. The method comprises wafer processing to form a plurality of lateral power transistors in a wafer, wherein an active area of each lateral power transistor is associated with a control pad, a first load pad and a second load pad of the semiconductor chip to be diced out of the wafer, and wherein at least one of the first load pad and the second load pad is segmented into a plurality of load pad segments which are electrically insulated from each other and which are each associated with a sub-area of the active area of the lateral power transistor; wafer testing to distinguish between non-defective sub-areas and defective sub-areas of the lateral power transistor; wafer dicing to singularize the semiconductor chips; and packaging the semiconductor chip, wherein only the load chip pad segments associated with non-defective sub-areas are electrically connected to a load terminal of the device package In Example 13, the subject matter of Example 12 can optionally include wherein electrically connecting the load chip pad segments to the load terminal is carried out by wire bonding, ribbon bonding or clip bonding.

In Example 14, the subject matter of Example 12 or 13 can optionally include storing information indicative of the load chip pad segments associated with non-defective sub-areas or with defective sub-areas in a wafer test map; and using this information during packaging.

In Example 15, the subject matter of Example 12 or 13 can optionally include marking the load chip pad segments associated with non-defective sub-areas or with defective sub-areas by applying test marks to the wafer; and using the test marks during packaging.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device package, comprising:
a semiconductor chip comprising a lateral power transistor, a control pad, a first load pad, and a second load pad, wherein at least one of the first load pad and the second load pad is segmented into a plurality of load pad segments electrically insulated from each other, and each load pad segment is associated with a sub-area of an active area of the lateral power transistor; and
device package terminals comprising a control terminal electrically connected to the control pad, a first terminal electrically connected to the one of the first load pad and the second load pad which is segmented into a plurality of load pad segments via a first electrical interconnect, and a second terminal electrically connected to the other load pad via a second electrical interconnect,
wherein the first electrical interconnect comprises a plurality of connector elements connecting to a subset of the load pad segments,
wherein the subset of the load pad segments is associated with non-defective sub-areas of the active area of the lateral power transistor;
wherein a load pad segment which is not connected to a connector element is associated with a defective sub-area of the active area of the lateral power transistor.

2. The device package of claim 1, wherein a connector element is a wire or a ribbon or a clip.

3. The device package of claim 1, wherein the first terminal is a source terminal of the transistor package.

4. The device package of claim 1, wherein the other load pad is also segmented into a plurality of load pad segments electrically insulated from each other, wherein the second electrical interconnect comprises a plurality of connector elements connecting to a subset of the load pad segments of the other load pad, and wherein the subset of the load pad segments of the other load pad is associated with non-defective sub-areas of the active area of the lateral power transistor.

5. The device package of claim 1, wherein the control pad is a common control pad electrically connected to a gate metallization layer of the semiconductor chip, and wherein the gate metallization layer electrically connects to a gate structure in each sub-area.

6. The device package of claim 1, wherein each load pad segment is electrically connected to an individual metallization layer section of the semiconductor chip which are electrically insulated from each other, and wherein the individual metallization layer sections are each electrically connected to the active area of the lateral power transistor, thereby defining the sub-areas.

7. The device package of claim 1, wherein the active area has one multi-finger gate structure of a regular pattern.

8. The device package of claim 7, wherein the multi-finger gate structure has a plurality of gate fingers in a range between 10 and 200.

9. The device package of claim 1, wherein each sub-area has a multi-finger sub-area gate structure, and wherein all multi-finger sub-area gate structures are of the same pattern.

10. The device package of claim 9, wherein each multi-finger sub-area gate structure has a plurality of gate fingers in a range between 1 and 20.

11. The device package of claim 1, wherein each sub-area comprises a gate metallization layer extending between individual metallization layer sections of the semiconductor chip which are electrically insulated from each other, and wherein each individual metallization layer section is electrically connected to the load pad segment associated with the sub-area.

12. A method of manufacturing a device package comprising a semiconductor chip, the semiconductor chip including a lateral power transistor, the method comprising:
wafer processing to form a plurality of lateral power transistors in a wafer, wherein an active area of each lateral power transistor is associated with a control pad, a first load pad and a second load pad of the semiconductor chip to be diced out of the wafer, and wherein at least one of the first load pad and the second load pad is segmented into a plurality of load pad segments which are electrically insulated from each other and which are each associated with a sub-area of the active area of the lateral power transistor;
wafer testing to distinguish between non-defective sub-areas and defective sub-areas of the lateral power transistor;
wafer dicing to singularize the semiconductor chips; and
packaging the semiconductor chip, wherein only the load chip pad segments associated with non-defective sub-areas are electrically connected to a load terminal of the device package.

13. The method of claim 12, wherein electrically connecting the load chip pad segments to the load terminal is carried out by wire bonding, ribbon bonding or clip bonding.

14. The method of claim 12, further comprising:
storing information indicative of the load chip pad segments associated with non-defective sub-areas or with defective sub-areas in a wafer test map; and
using this information during packaging.

15. The method of claim 12, further comprising:
marking the load chip pad segments associated with non-defective sub-areas or with defective sub-areas by applying test marks to the wafer; and
using the test marks during packaging.

* * * * *